(12) United States Patent
An et al.

(10) Patent No.: US 6,458,639 B1
(45) Date of Patent: Oct. 1, 2002

(54) MOS TRANSISTOR WITH STEPPED GATE INSULATOR

(75) Inventors: Judy Xilin An, San Jose, CA (US); Bin Yu, Fremont, CA (US); Ming-Ren Lin, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/773,828

(22) Filed: Jan. 31, 2001

Related U.S. Application Data

(62) Division of application No. 09/145,786, filed on Sep. 2, 1998, now Pat. No. 6,225,661.

(51) Int. Cl.$^7$ .................. H01L 29/74; H01L 31/111; H01L 23/48
(52) U.S. Cl. .................. 438/163; 438/264; 438/287; 438/770; 438/981; 438/179; 257/336
(58) Field of Search ................ 438/163, 179, 438/287, 981, 264, 770; 257/336

(56) References Cited

U.S. PATENT DOCUMENTS

| | | | | |
|---|---|---|---|---|
| 5,445,983 A | * | 8/1995 | Hong | 437/43 |
| 5,716,861 A | * | 2/1998 | Moslehi | 437/40 |
| 5,960,270 A | * | 9/1999 | Misra et al. | 438/197 |
| 6,077,749 A | * | 6/2000 | Gardner et al. | 438/299 |
| 6,200,843 B1 | * | 3/2001 | Bryant et al. | 438/216 |

* cited by examiner

Primary Examiner—Jerome Jackson
Assistant Examiner—Shrinivas H. Rao
(74) Attorney, Agent, or Firm—LaRiviere, Grubman & Payne, LLP

(57) ABSTRACT

A field effect transistor (FET) is formed on a silicon substrate, with a nitride gate insulator layer being deposited on the substrate and an oxide gate insulator layer being deposited on the nitride layer to insulate a gate electrode from source and drain regions in the substrate. The gate material is then removed to establish a gate void, and spacers are deposited on the sides of the void such that only a portion of the oxide layer is covered by the spacers. Then, the unshielded portion of the oxide layer is removed, thus establishing a step between the oxide and nitride layers that overlays the source and drain extensions under the gate void to reduce subsequent capacitive coupling and charge carrier tunneling between the gate and the extensions. The spacers are removed and the gate void is refilled with gate electrode material.

9 Claims, 3 Drawing Sheets

MOS TRANSISTOR WITH STEPPED GATE INSULATOR

This divisional application is related to copending U.S. patent application Ser. No. 09/145,786, now U.S. Pat. No. 6,225,661, filed Sep. 2, 1998, entitled "MOS TRANSISTOR WITH STEPPED GATE INSULATOR."

TECHNICAL FIELD

The present invention relates generally to semiconductor fabrication, and more particularly to methods for fabricating improved ultra-large scale integration (ULSI) semiconductor devices such as ULSI metal oxide silicon field effect transistors (MOSFETs).

BACKGROUND OF THE INVENTION

Semiconductor chips or wafers are used in many applications, including as processor chips for computers, and as integrated circuits and as flash memory for hand held computing devices, wireless telephones, and digital cameras. Regardless of the application, it is desirable that a semiconductor chip hold as many circuits or memory cells as possible per unit area. In this way, the size, weight, and energy consumption of devices that use semiconductor chips advantageously is minimized, while nevertheless improving the memory capacity and computing power of the devices.

A common circuit component of semiconductor chips is the transistor. In ULSI semiconductor chips, a transistor is established by forming a polysilicon gate on a silicon substrate, and then forming a source region and a drain region side by side in the substrate beneath the gate by implanting appropriate dopant materials into the areas of the substrate that are to become the source and drain regions. The gate is insulated from the source and drain regions by a thin gate oxide layer. This generally-described structure cooperates to function as a transistor.

To facilitate cooperation between the gate and the source and drain regions, most of the source and drain regions do not lie directly under the gate. However, a small part of the source region does overlap the gate, and likewise a small part of the drain region extends directly under the gate. These small parts of the source and drain regions that overlap the gate are respectively referred to as the source and drain extensions.

While the present invention understands that such extensions enhance the coupling between the gate and the channel that is established by the source and drain regions, the present invention also understands that capacitive coupling is induced between the gate and the source/drain extensions. As recognized herein, such capacitive coupling degrades the performance of the transistor in alternating current (AC) applications. The importance of this consideration grows as the size of the transistors is reduced by ULSI technology, because while the overall dimensions of the transistors are smaller (and in particular the gate length), the amount by which the source/drain extensions overlap the gate have heretofore remained unchanged. Accordingly, the ratio between the amount of overlap to gate length is increased as gate length is shortened, thus magnifying the undesirable effects of capacitive coupling between the gate and the source/drain extensions in very small transistors.

Moreover, owing to the very small thickness of the insulating gate oxide layer between the gate and the source/drain extension regions, and the relatively high electric field across the gate oxide layer, charge carriers undesirably can tunnel across the gate oxide layer. This renders the transistor "leaky", degrading its performance. Accordingly, the present invention understands that it is desirable to minimize the overlap between the gate of a transistor and the source/drain extension regions of the transistor.

One approach to the above-noted problem would be to simply space apart the source and drain regions from each other and, hence, reduce the overlap between the source/drain extensions and the gate. This could be done by forming the gate, then forming spacers on the side of the gate, and then implanting dopant into the substrate to establish the source and drain, with the spacers blocking the implantation of dopant in the substrate near the sides of the gate. As recognized herein, however, a drawback of such a process is that the channel length would be enlarged. An enlarged channel length in turn would reduce the transistor drive current and thereby reduce the speed of operation of the circuit.

BRIEF SUMMARY OF THE INVENTION

A method is disclosed for forming one or more field effect transistors (FET) on a semiconductor substrate. The method includes forming a lower gate insulator on the substrate, and the lower gate insulator defines a length and is substantially continuous along the length. An upper gate insulator is formed on the lower gate insulator such that the upper gate insulator is not substantially continuous along the length and such that a gate step is established by the lower and upper insulators. Then, a gate electrode is formed on the gate insulators. In a preferred embodiment, the lower gate insulator includes nitride, and the upper gate insulator includes oxide.

In a preferred embodiment of the present method, the gate insulators are initially formed as continuous layers, and a gate is formed above the gate insulators. Source and drain regions are then established in the substrate, with the source and drain regions respectively having source and drain extensions that extend under the gate. Also, a field oxide layer is formed on the substrate adjacent the gate. The gate is then removed to establish a gate void above the gate insulators, and one or more spacers are formed adjacent the wall in the gate void. As intended by the present invention, the spacers cover only a shielded portion of the upper insulator, and do not cover an unshielded portion of the upper insulator. Accordingly, the unshielded portion can be removed by etching, to thereby establish the gate step prior to the forming of the gate electrode on the gate insulators. The spacers are configured such that the gate step is substantially directly above the source and drain extensions, to suppress capacitive coupling between the gate electrode and the source/drain extensions. A semiconductor device made in accordance with the present method, and a digital processing apparatus incorporating the semiconductor device, are also disclosed.

In another aspect, a method for making a semiconductor device includes depositing at least upper and lower gate insulators on a semiconductor substrate, and depositing at least one field oxide layer above the substrate. Also, the method includes establishing at least one gate void in the field oxide layer. Moreover, the method includes removing only a portion of the upper gate insulator in the gate void, and then filling the gate void with a field effect transistor gate material.

In yet another aspect, a semiconductor device includes at least one field effect transistor (FET) defining a gate disposed above a silicon substrate and source and drain regions in the silicon substrate. Per the present invention, the source and drain regions include source and drain extensions that are separated from each other by a substantially undoped channel region. Plural layers of gate insulator material are disposed between the gate and the extensions, with only a single layer of gate insulator material being disposed between the gate and the channel region.

Other features of the present invention are disclosed or apparent in the section entitled "DETAILED DESCRIPTION OF THE INVENTION".

DETAILED DESCRIPTION OF THE INVENTION

Figure 1:
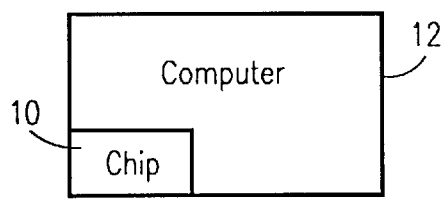
FIG. 1 is a schematic diagram of a semiconductor device made according to the present invention, shown in combination with a digital processing apparatus.

Referring initially to FIG. 1, a semiconductor device embodied as a chip 10 is shown incorporated into a digital processing apparatus such as a computer 12. The chip 10 is made in accordance with the below disclosure.

Figure 2:
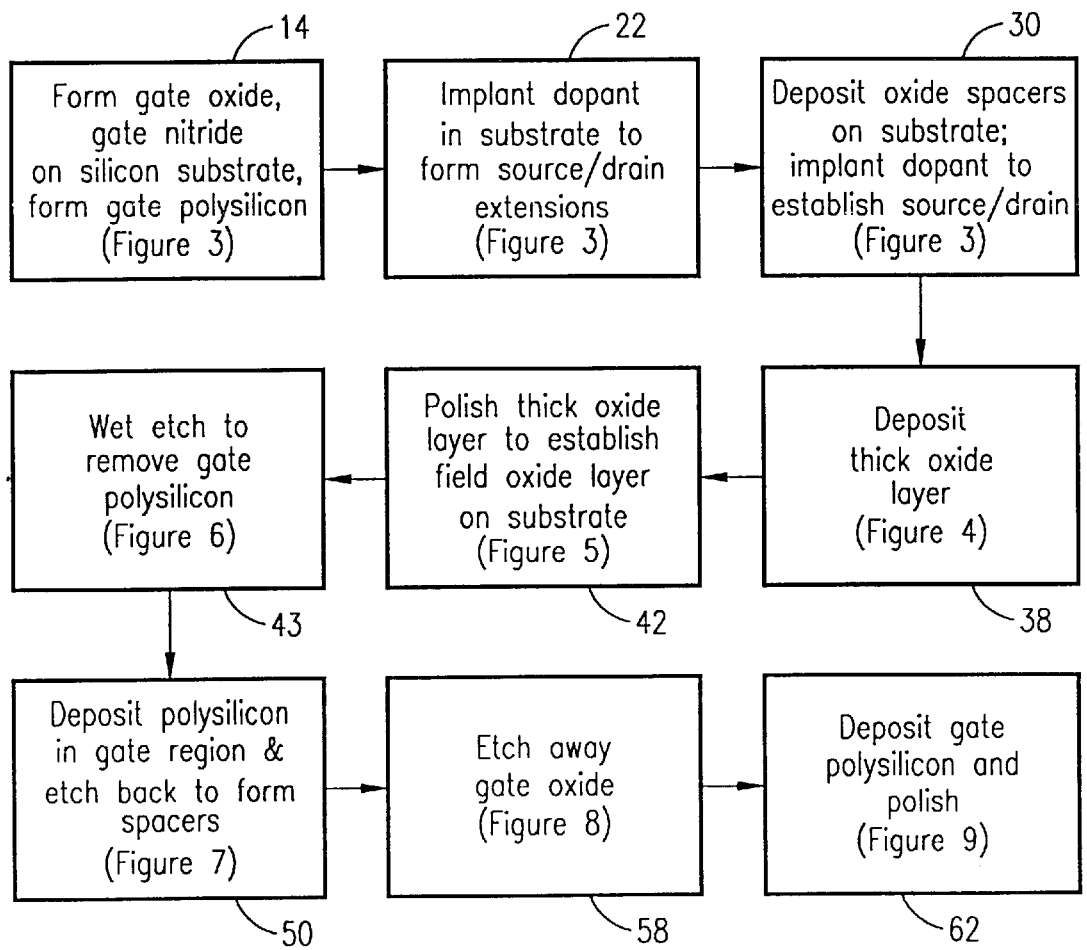
FIG. 2 is a flow chart showing the steps of the present invention.
Figure 3:
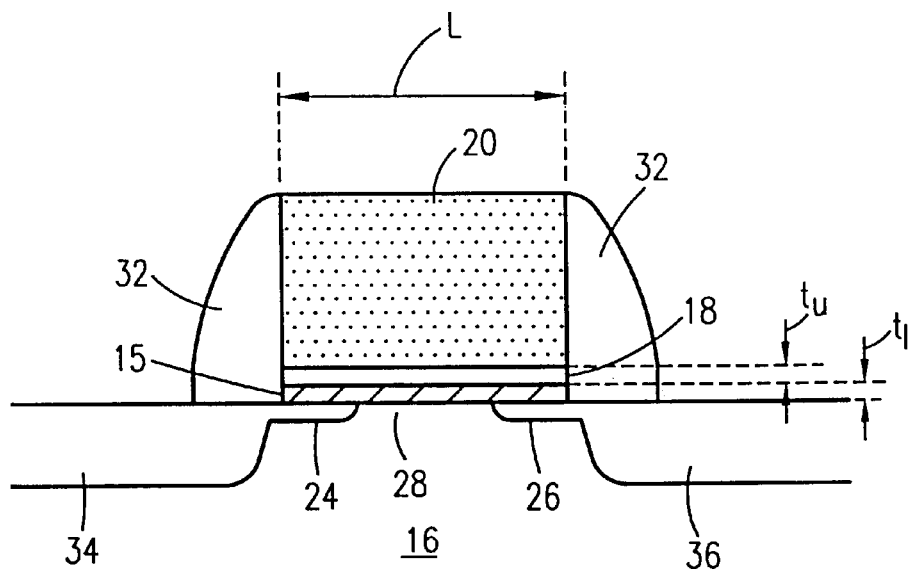
FIG. 3 is a partial cross-section of the device after the gate polysilicon, gate oxide and gate nitride insulating layers, and source/drain regions with extensions have been formed.

Now referring to FIGS. 2 and 3, as indicated at block 14 in FIG. 2 and as shown in FIG. 3, using conventional semiconductor fabrication techniques a lower gate insulator layer 15 is deposited on a semiconductor substrate 16. Then, an upper gate insulator layer 18 is deposited on the lower gate insulator layer 15. The insulator layer 15 is "lower" by virtue of being disposed closer to the substrate 16 than the upper insulator layer 18.

FIG. 3 shows that the lower insulator layer 15 defines a thickness $t_l$, and the upper insulator layer 18 defines a thickness $t_u$. In accordance with the present invention, the thickness $t_l$ of the lower insulator layer 15 is established as appropriate for the desired transistor performance, because the lower layer 15, as will become clearer after subsequent disclosure, will function as the insulator in the channel region. On the other hand, the thickness $t_u$ of the upper insulator layer 18 is established as appropriate for the desired suppression of capacitive coupling between the gate and the extensions 24, 26, as will become clearer after subsequent disclosure. In the presently preferred embodiment, the thickness $t_l$ of the lower insulator layer 15 is between about two nanometers and four nanometers (2 nm–4 nm), while the thickness $t_u$ of the upper insulator layer 18 is between about ten nanometers and twenty nanometers (10 nm–20 nm).

Next, a gate 20 is formed above the insulator layers 15, 18. For disclosure purposes the gate 20 defines a gate length "L", and the insulator layers 15, 18 extend under the gate 20 substantially completely along the length "L" of the gate 20. More specifically, the insulator layers 15, 18 shown in FIG. 3 each extend substantially continuously along the length "L" and do not extend past the length "L". In the preferred embodiment, the substrate 16 includes silicon, the lower gate insulator layer includes nitride, the upper gate insulator layer 18 includes oxide, and the gate 20 includes polysilicon.

Moving to block 22 of FIG. 2 and still referring to FIG. 3, appropriate dopant materials are implanted into the substrate 16 by conventional means to establish source and drain region extensions 24, 26 that extend directly under the gate 20. As further shown in FIG. 3, the source and drain extensions 24, 26 are separated from each other by a substantially undoped channel region 28 in the substrate 16.

Moving to block 30 in FIG. 2 and in continued reference to FIG. 3, sidewall oxide spacers 32 are formed on the substrate 16 next to the gate 20 in accordance with principles known in the art. Then, the formation of source and drain regions 34, 36, which was started by forming the extensions 24, 26, is completed by implanting dopant as appropriate into the regions 34, 36.

Figure 4:
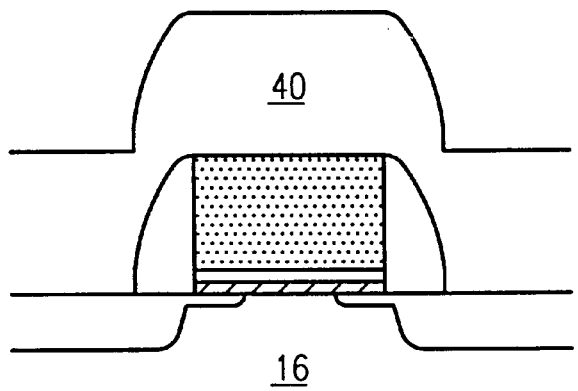
FIG. 4 is a partial cross-section of the device after thick field oxide deposition.
Figure 5:
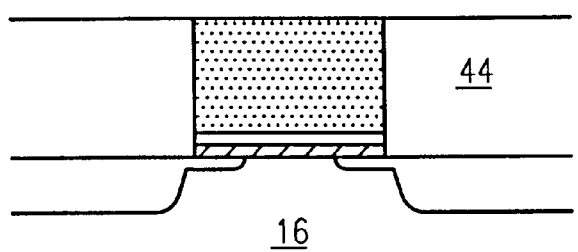
FIG. 5 is a partial cross-section of the device after chemical-mechanical polishing (CMP)

Proceeding to block 38 in FIG. 2 and now referring to FIG. 4, a thick oxide layer 40 is deposited over the above-described structure. As indicated at block 42 in FIG. 2 and as shown in FIG. 5, the oxide layer 40 is partially removed by, e.g., chemical mechanical polishing (CMP) such that the top of the oxide layer 40 is flush with the top of the gate 20, to thereby establish a field oxide layer 44 on the substrate 16 for well-understood component insulation purposes.

Figure 6:
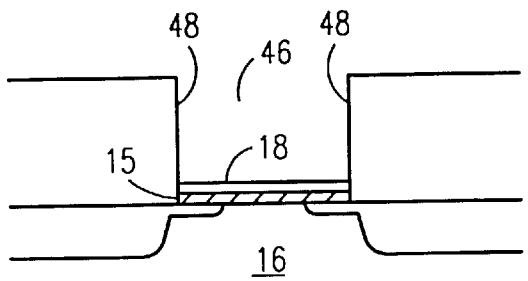
FIG. 6 is a partial cross-section of the device after etching away of the gate polysilicon.

Those skilled in the art will recognize that the above-described steps are conventional fabrication processes used for making semiconductor devices in accordance with low pressure chemical vapor deposition (LPCVD) principles. Moving to block 43 of FIG. 2 and now referring to FIG. 6, however, the present invention envisions removing the polysilicon gate 20 using high selectivity wet etching, to render the structure shown in FIG. 6 in which a gate void 46 having wall 48 is established above the insulator layers 15, 18. As shown, the insulator layers 15, 18 remain after the selective wet etch.

Figure 7:
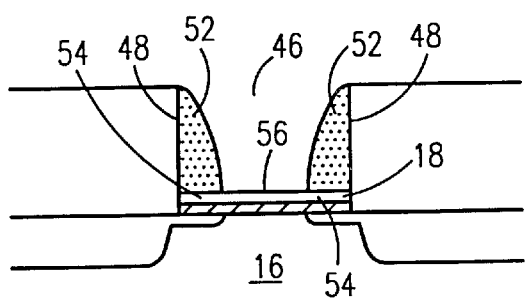
FIG. 7 is a partial cross-section of the device after formation of the doped polysilicon spacers in the gate void.

Proceeding to block 50 in FIG. 2 and now referring to FIG. 7, a spacer material, preferably polysilicon, is deposited in the gate void 46 and then etched back to establish spacers 52. As shown in FIG. 7, the spacers 52 are adjacent the wall 48. Also, the spacers 52 cover only a shielded portion 54 of the upper insulator layer 18, and the spacers do not cover an unshielded portion 56 of the upper insulator layer 18. Per the present invention, the spacers 52 are configured as appropriate to establish the desired gate length.

Figure 8:
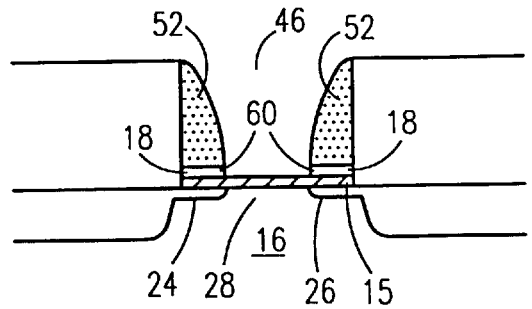
FIG. 8 is a partial cross-section of the device after the gate oxide layer has been removed in the gate void, leaving only the gate nitride layer in gate void.
Figure 9:
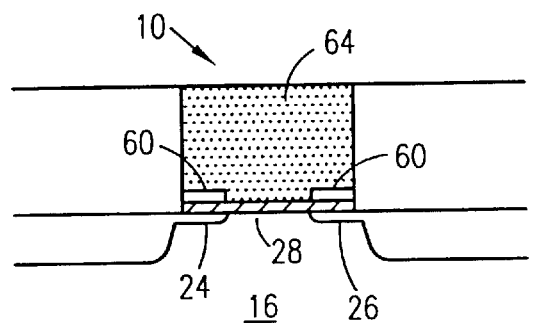
FIG. 9 is a partial cross-section of the device after deposition of gate polysilicon in the gate void, and after CMP.

Next, as indicated at block 58 of FIG. 2 and as shown in FIG. 8, the unshielded portion 56 of the upper insulator layer 18 is removed, preferably by etching that is self-limiting in that no portions of the lower insulator layer 15 are removed. With this in mind, a gate step 60 is established by the lower and upper insulator layers 15, 18, with the gate step 60 being located substantially directly above the source and drain extensions 24, 26 but not extending above the undoped channel region 28.

Completing the description, at block 62 in FIG. 2 the spacers 52 are etched away and a gate electrode material is deposited in the gate void 46, above the insulator layers 15, 18. The gate electrode material is polished as necessary to establish a gate electrode 64, the top surface of which is substantially flush with the top surface of the field oxide layer 44. In one preferred embodiment, the gate electrode 64 is made of appropriately doped polysilicon. It is to be understood that while the disclosure above focusses on a single transistor for clarity of disclosure, the chip 10 can include plural transistors each susbtantially identical to the transistor shown in described above, as well as other circuit components.

While the particular MOS TRANSISTOR WITH STEPPED GATE INSULATOR as herein shown and described in detail is fully capable of attaining the above-described objects of the invention, it is to be understood that it is the presently preferred embodiment of the present invention and is thus representative of the subject matter which is broadly contemplated by the present invention, that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more". All structural and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims.

What is claimed is:

1. A method of fabricating a semiconductor device, comprising:
    providing a semiconductor substrate having a source region and a drain region therein, said source and drain regions respectively comprising source and drain extensions and being separated by a substantially undoped channel region; and
    forming at least one field effect transistor (FET), said FET forming step comprising the substeps of:
        forming a lower gate insulator layer on said substrate over said extensions and said channel region;
        forming an upper gate insulator layer on said lower gate insulator layer;
        forming a gate on said lower gate insulator layer disposed over said channel region and on said upper gate insulator layer,
    said lower gate insulator layer being disposed between said extensions and said gate,
    said upper gate insulator layer being disposed between said extensions and said gate, and sandwiched between the upper gate insulator layer and the gate, whereby only a single layer on the gate insulator layers is disposed between the gate and the channel region,
    said lower gate insulator layer including at least one nitride, and
    said upper gate insulator layer including at least one oxide.

2. A method, as recited in claim 1,
    wherein said gate has two sides,
    wherein said method further comprises forming a field oxide layer on the substrate disposed on both sides of the gate,
    wherein said lower gate insulator layer forming step comprises forming said lower gate insulator layer as a continuous layer, and
    wherein said upper gate insulator layer is initially formed as a continuous layer.

3. A method, as recited in claim 2, further comprising;
    removing the gate to form a gate void above said lower gate insulator layer and said upper gate insulator layer, the gate void defining two walls;
    forming at least one spacer adjacent the two walls, the at least one spacer covering only a portion of said upper gate insulator layer, thereby leaving an uncovered portion of said upper gate insulator layer; and
    removing the uncovered portion to form an upper and lower gate insulator layers step prior to the forming of a gate electrode on said lower gate insulator layer and said upper gate insulator layer.

4. A method, as recited in claim 3, wherein the upper and lower gate insulator layers step is directly disposed above the source and drain extensions.

5. A method of fabricating a semiconductor device, comprising:
    providing a semiconductor substrate having a source region and a drain region therein, said source and drain regions respectively comprising source and din extensions and being separated by a substantially undoped channel region; and
    forming at least one field effect transistor (PET), said FET forming step comprising the substeps of:
        for a lower gate insulator layer on said substrate over said extensions and said channel region;
        forming au upper gate insulator layer on said lower gate insulator layer;
        forming a gate on said lower gate insulator layer disposed over said channel region and on said upper gate insulator layer, said gate forming step comprising the substeps of:
            depositing a field oxide layer above the substrate;
            forming a gate void in the field oxide layer,
        said lower gate insulator layer being disposed between said extensions and said gate, and sandwiched between the upper gate insulator layer and the gate, in said upper gate insulator layer being disposed between said extensions and said gate,
            removing only a portion of said second layer of gate insulator material whereby only a single layer on the gate insulator layers is disposed between the gate and the channel region. disposed under the gate void; and
            filling the gate void with a gate material, said lower gate insulator layer being disposed on the substrate, and said upper gate insulator layer being disposed between said lower gate insulator layer and the gate material,
    said lower gate insulator layer including at least one nitride, and
    said upper gate insulator layer including at least one oxide.

6. A method, as recited in claim 5,
    wherein said lower gate insulator layer is substantially continuous along a length direction, and
    wherein said upper gate insulator layer is discontinuous along the length direction such that a step is formed by said lower gate insulator layer and said upper gate insulator layer, and by depositing the gate material in said void to form a stepped gate, said step and gate having two sides.

7. A method, as recited in claim 6, wherein said field oxide layer is disposed on both sides of the gate.

8. A method, as recited in claim 7, fur comprising:
- removing the gate to form a gate void above said lower gate insulator layer and said upper gate insulator layer, the gate void defining two walls of said field oxide layer;
- forming at least one spacer adjacent the field oxide layer wall which covers only a portion of said upper gate insulator layer, thereby leaving an uncovered portion of said upper gate insulator layer; and
- etching the uncovered portion of said upper gate insulator layer, thereby forming the upper and lower gate insulator layers step prior to the forming of the gate on said lower and gate insulator layers.

9. A method, as recited in claim 8, wherein the upper, and lower gate insulator layers step is directly disposed above the source and drain extensions.

* * * * *

UNITED STATES PATENT AND TRADEMARK OFFICE
CERTIFICATE OF CORRECTION

PATENT NO. : 6,458,639 B1
DATED : October 1, 2002
INVENTOR(S) : Judy Xilin An, Bin Yu and Ming-Ren Lin It is certified that error appears in the above-identified patent and that said Letters Patent is hereby corrected as shown below:

Column 6,
Line 22, delete "din" and replace with -- drain --.
Line 25, delete "(PET)" and replace with -- (FET) --.
Line 27, delete "for" and replace with -- forming --.
Line 29, delete "au" and replace with -- an --.
Line 63, delete "step and" and replace with -- stepped --.

Column 7,
Line 1, delete "fur" and replace with -- further --.

Signed and Sealed this

Twenty-eighth Day of January, 2003

JAMES E. ROGAN
*Director of the United States Patent and Trademark Office*